United States Patent
Miura

(10) Patent No.: US 10,347,603 B2
(45) Date of Patent: Jul. 9, 2019

(54) SEMICONDUCTOR DEVICE MANUFACTURING APPARATUS AND METHOD

(71) Applicant: TOSHIBA MEMORY CORPORATION, Tokyo (JP)

(72) Inventor: Masayuki Miura, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 560 days.

(21) Appl. No.: 15/061,970

(22) Filed: Mar. 4, 2016

(65) Prior Publication Data

US 2016/0336291 A1 Nov. 17, 2016

(30) Foreign Application Priority Data

May 12, 2015 (JP) .................................. 2015-097594

(51) Int. Cl.
*B23K 20/00* (2006.01)
*B23K 20/02* (2006.01)
*H01L 23/00* (2006.01)

(52) U.S. Cl.
CPC .............. *H01L 24/75* (2013.01); *H01L 24/81* (2013.01); *H01L 2224/131* (2013.01); *H01L 2224/7592* (2013.01); *H01L 2224/75251* (2013.01); *H01L 2224/75252* (2013.01); *H01L 2224/75502* (2013.01); *H01L 2224/75745* (2013.01);
(Continued)

(58) Field of Classification Search
CPC H01L 2224/81801; H01L 2224/81815; H05K 2203/0278; H05K 3/3436; H05K 2203/0195; H05K 13/0465; H05K 2203/163; H05K 3/341
USPC .......................... 228/102, 103, 44.3, 47.1, 4.1
See application file for complete search history.

(56) References Cited

U.S. PATENT DOCUMENTS 9,398,736 B2 * 7/2016 Nagai ..................... H01L 24/75
2007/0181644 A1 8/2007 Ueno et al.
(Continued)

FOREIGN PATENT DOCUMENTS

JP H09-153522 A 6/1997
JP 2002-57190 A 2/2002
(Continued)

OTHER PUBLICATIONS

Notice of Reasons for Refusal dated Apr. 25, 2018 in corresponding Japanese Patent Application No. 2015-097594 with English translation, 10 pages.
(Continued)

*Primary Examiner* — Erin B Saad
(74) *Attorney, Agent, or Firm* — Kim & Stewart LLP

(57) ABSTRACT

A semiconductor device manufacturing apparatus includes a stage, a head section facing the stage and configured to hold a semiconductor element, a driving section configured to drive one of the head section and the stage to move in a first direction intersecting the head section and the stage and apply a load to the other one of the stage and the head section, a load sensor configured to sense a load value of the applied load, and a controller configured to control the driving section to move one of the head section and the stage, and then separate the head section from the stage in accordance with a change in the load value.

9 Claims, 6 Drawing Sheets

(52) U.S. Cl.
CPC ............... *H01L 2224/75753* (2013.01); *H01L 2224/81193* (2013.01); *H01L 2224/81203* (2013.01)

(56) References Cited

U.S. PATENT DOCUMENTS

| | | | | |
|---|---|---|---|---|
| 2009/0289098 | A1* | 11/2009 | Terada | H01L 24/75 228/102 |
| 2013/0260534 | A1* | 10/2013 | Khanna | H01L 24/75 438/457 |
| 2014/0175159 | A1* | 6/2014 | Kostner | H01L 24/75 228/102 |

FOREIGN PATENT DOCUMENTS

| | | |
|---|---|---|
| JP | 2005-353696 A | 12/2005 |
| JP | 2006-324702 A | 11/2006 |
| JP | 2010-219334 A | 9/2010 |
| TW | 2006-05246 | 2/1996 |
| TW | 2012-30214 | 7/2012 |

OTHER PUBLICATIONS

Taiwanese Office Action dated Jan. 17, 2017, filed in Taiwanese counterpart Patent Application No. 105100072, 13 pages (with English Translation).
Notification of Reasons for Refusal dated Nov. 9, 2018 in corresponding Japanese Patent Application No. 2015-097594 with English translation, 6 pages.

* cited by examiner

SEMICONDUCTOR DEVICE MANUFACTURING APPARATUS AND METHOD

CROSS-REFERENCE TO RELATED APPLICATION

This application is based upon and claims the benefit of priority from Japanese Patent Application No. 2015-097594, filed May 12, 2015, the entire contents of which are incorporated herein by reference.

FIELD

Embodiments described herein relate generally to semiconductor device manufacturing apparatuses and methods.

BACKGROUND

A semiconductor device is provided with solder bumps.

DETAILED DESCRIPTION

Embodiments provide a semiconductor device manufacturing apparatus and facilitate manufacturing of a semiconductor device.

In general, according to one embodiment, a semiconductor device manufacturing apparatus includes a stage, a head section facing the stage and configured to hold a semiconductor element, a driving section configured to drive one of the head section and the stage to move in a first direction intersecting the head section and the stage and apply a load to the other one of the stage and the head section, a load sensor configured to sense a load value of the applied load, and a controller configured to control the driving section to move one of the head section and the stage, and then separate the head section from the stage in accordance with a change in the load value.

Hereinafter, an embodiment will be described with reference to FIGS. 1 to 8. Herein, the drawings are schematic drawings and, for example, the relationship between the thickness and the planar size and the thickness ratio between the layers do not always coincide with the actual relationship and thickness ratio. Moreover, vertical and horizontal directions also indicate relative directions which are determined if a semiconductor substrate which will be described later herein is placed such that a circuit formation face thereof is set as an upper or lower face, and do not always coincide with the directions which are determined based on the direction of acceleration of gravity.

Figure 1:
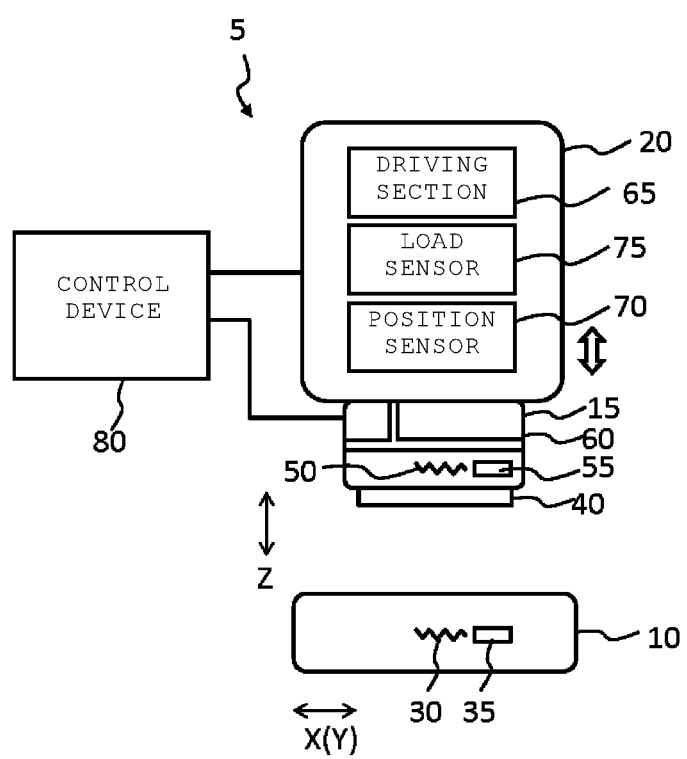
FIG. 1 is a schematic configuration diagram of a semiconductor device manufacturing apparatus according to an embodiment.

FIG. 1 is a schematic diagram depicting the configuration of a semiconductor device manufacturing apparatus 5. The manufacturing apparatus 5 includes, on the lower side thereof, a stage 10 formed of ceramic or the like and, on the upper side thereof, above the stage 10, a head section 15. The manufacturing apparatus 5 includes a supporting section 20 that supports the head section 15. The manufacturing apparatus 5 includes a control device 80 that controls the stage 10, the head section 15, and the supporting section 20. The stage 10 is separated from the other component elements in FIG. 1, but the manufacturing apparatus 5 may be provided as an integrated structure as a whole via an external structure (not depicted). Moreover, the head section 15 may be integrated with the supporting section 20 to form the head section 15. In the following description, the vertical direction is referred to as a Z-axis direction and the horizontal direction is referred to as an XY-axes direction.

Figure 3A:
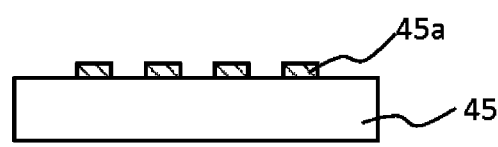
FIGS. 3A to 3C are schematic sectional views depicting the states of a semiconductor device according to the embodiment before and after processing.
Figure 3B:
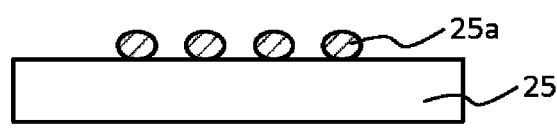

The stage 10 is configured to hold a substrate 25 depicted in FIG. 3B on an upper face thereof. The substrate 25 is, for example, a ceramic substrate or a glass epoxy substrate. The stage 10 includes a stage heater 30 and a temperature sensor 35. The stage heater 30 is configured to heat the stage 10, thereby heating the substrate 25 held on the upper face of the stage 10 to a predetermined temperature. The temperature sensor 35 is configured to sense the temperature of the stage 10. The temperature sensor 35 can indirectly sense the temperature of the substrate 25 held on the upper face of the stage 10 by sensing the temperature of the stage 10, for example.

The stage heater 30 heats solder bumps 25a provided on the substrate 25 depicted in FIG. 3B to a fixed temperature (for example, 150° C.), which is lower than the solder bump 25a melting point, by heating the stage 10. The stage heater 30 is controlled based on the temperature sensed by the temperature sensor 35.

The head section 15 includes a bonding tool 40 which faces the stage 10. The head section 15 is configured to hold a semiconductor element such as a semiconductor element 45 depicted in FIG. 3A by applying suction to chuck the semiconductor element thereto by suction. The head section 15 includes a head heater 50 and a temperature sensor 55. The head section 15 also includes a hole 60 formed therein. The hole 60 passes high-pressure air therethrough for cooling the head section 15, for example.

The head heater 50 generates heat using electrical power, for example. The heat generated by the head heater 50 causes the head section 15 to rise in temperature. Moreover, the head heater 50 heats the bonding tool 40, thereby heating the semiconductor element 45 held on the bonding tool 40.

The supply of heat to the head section 15 and the head heater 50 is controlled by changing the power flowing through the head heater 50. When the power supply is interrupted or changed, the supply of heat may be stopped or changed.

Moreover, by supplying high-pressure air through the hole 60, the head section 15 may be cooled quickly.

The temperature sensor 55 is configured to sense the temperature of the head section 15. The temperature sensor 55 may indirectly sense the temperature of the semiconductor element 45 held on the bonding tool 40 by sensing the temperature of the bonding tool 40, for example.

The supporting section 20 includes a driving section 65, a position sensor 70, and a load sensor 75.

The driving section 65 moves the head section 15 in the Z-axis direction (the vertical direction). That is, the driving section 65 moves the head section 15 toward and away from the stage 10 and may reduce or increase the distance between the head section 15 and the stage 10. Furthermore, the driving section 65 is also capable of causing the head section 15 to apply a load toward the stage 10.

The position sensor 70 senses the position of the head section 15 in the Z-axis direction. The position sensor 70 may indirectly sense the position of the head section 15 in the Z-axis direction. For example, the position sensor 70 may sense the position of the head section 15 based on, for example, the driven amount of the driving section 65, the position of the supporting section 20 in the Z-axis direction, the moving amount of the supporting section 20, or the like.

The load sensor 75 senses the load value of the head section 15. For example, when the head section 15 is moved downwardly, the driving section 65 or the head section 15 applies a load to the stage 10 with the semiconductor element 45 held on the bonding tool 40 interposed therebetween. The load sensor 75 senses the load applied to the stage 10. The load sensor 75 may indirectly sense the load. For example, the load sensor 75 may sense the load based on, for example, the force required for driving the driving section 65.

The position sensor 70 and the driving section 65 or the load sensor 75 and the driving section 65 may be provided as an integrated unit.

The control device 80 can control the position of the head section 15 in the Z-axis direction by sensing the position of the head section 15 in the Z-axis direction based on a signal from the position sensor 70. This control performed by using the position sensor 70 is suitable for high-speed movement of the head section 15.

On the other hand, the control device 80 can control the position of the head section 15 in the Z-axis direction based on the magnitude of the load value by sensing the load value of the head section 15 based on a signal from the load sensor 75. This control performed using the load sensor 75 is suitable for a subtle movement and a movement based on the load applied by the head section 15 against the substrate 25, semiconductor element 45 and stage 10.

In other words, the head section 15 is capable of performing control based on a sensing signal of the position sensor 70 and performing control based on a sensing signal of the load sensor 75.

The control device 80 includes a CPU, memory, and so forth and performs overall control of the apparatus in accordance with a program. The control device 80 controls the movements of the sections such as the stage 10, the head section 15, and the supporting section 20 in accordance with a program which will be described later herein.

The manufacturing apparatus 5 further includes a position detecting camera (not depicted). The position detecting camera can sense the positions of the substrate 25 on the stage 10 and the semiconductor element 45 held on the bonding tool 40 of the head section 15 in the XY-axes direction (the horizontal direction). The control device 80 can thus control the movements of the head section 15 in the XY-axes direction and in the rotation direction in a horizontal plane based on an image sensed by the position detecting camera.

Next, a semiconductor device manufacturing process performed by the manufacturing apparatus 5 will be described.

FIG. 3A is a schematic sectional view of the semiconductor element 45 discussed earlier. The semiconductor element 45 is obtained as a semiconductor substrate with integrated circuits built on the front surface thereof, the integrated circuits obtained by various processing processes. On the surface (the upper face) of the semiconductor element 45, a plurality of metal pads 45a are placed. The metal pads 45a are metal electrodes that may electrically connect to an external element.

FIG. 3B is a schematic sectional view of the substrate 25. The substrate 25 is, for example, a rigid substrate, a flexible substrate, or the like. More specifically, for example, the substrate 25 is any one of various printed substrates such as a ceramic substrate and a glass epoxy substrate. On the surface (the upper face) of the substrate 25, an electrode pattern (not depicted) is placed and the solder bumps 25a are placed on the electrode pattern. As will be described later, the substrate 25 may electrically connect to the metal pads 45a of the semiconductor element 45 via the solder bumps 25a. Additionally, on the front or rear surface of the substrate 25 various terminal sections other than the solder bumps 25a and the terminal sections for connection with an external circuit may be placed.

Figure 3C:
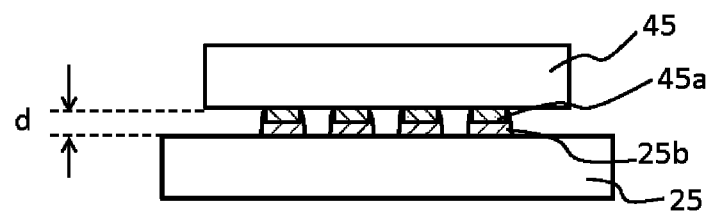

FIG. 3C is a schematic sectional view depicting a state in which the semiconductor element 45 is mounted on the substrate 25 described above. The semiconductor element 45 and the substrate 25 are positioned spaced from each other by a distance d. The solder bumps 25a of the substrate 25 form solder 25b as a result of being melted and crushed during mounting. The solder 25b electrically connects to the metal pads 45a of the semiconductor element 45.

A process of mounting the semiconductor element 45 on the substrate 25, the process performed by the manufacturing apparatus 5, will be described with reference to FIG. 2 and FIGS. 4 to 8.

Figure 2:
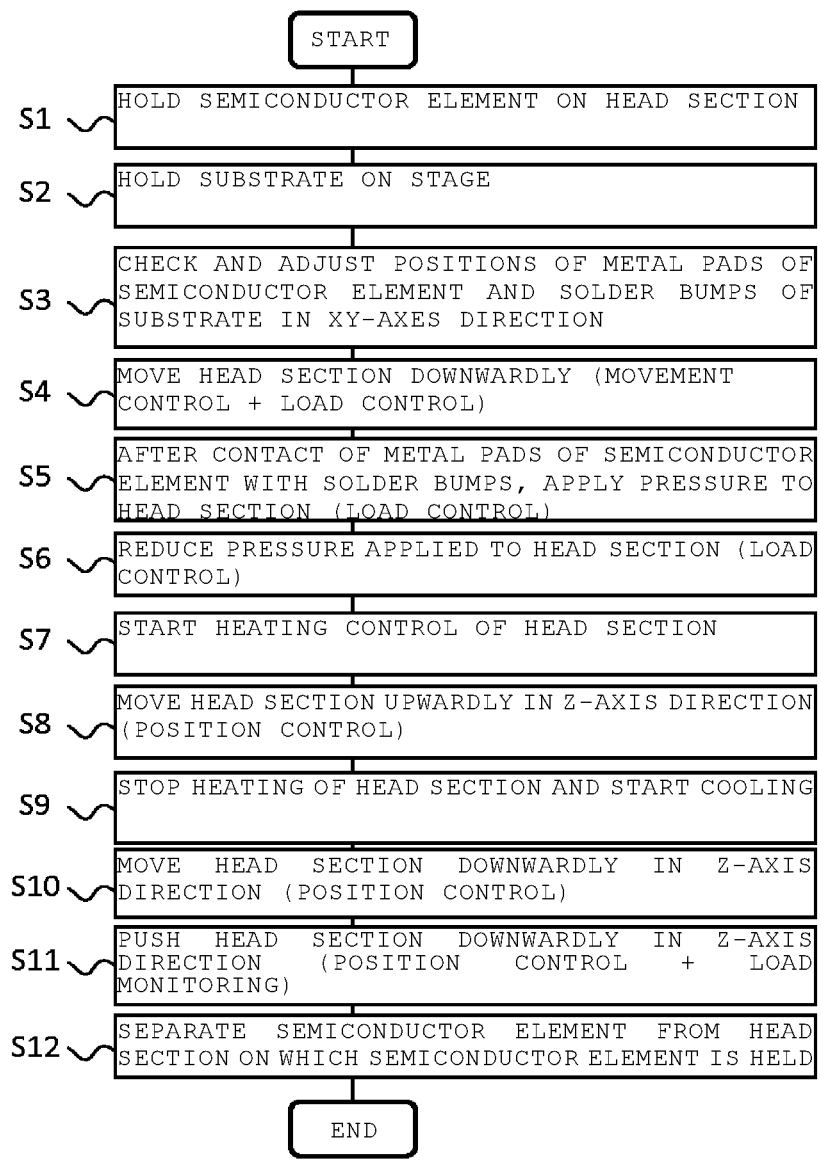
FIG. 2 is a flow diagram depicting the flow of a semiconductor device manufacturing method according to the embodiment.
Figure 7:
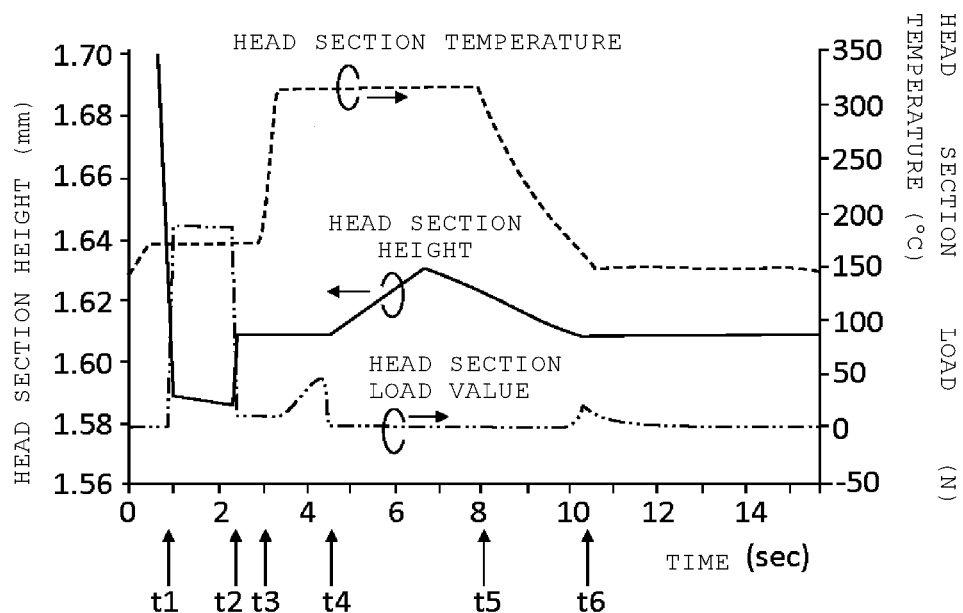
FIG. 7 is a diagram depicting temporal changes in the temperature of a head section, the load value of the head section, and the height of the head section.

FIG. 2 is a process flow diagram schematically depicting a mounting process control operation performed by the control device 80 of the manufacturing apparatus 5. FIG. 7 depicts changes in the temperature of the head section 15, changes in the load value of the head section 15, and changes in the height of the head section 15 with respect to the stage or the substrate on the stage during the operational flow of a series of processes. With reference to FIG. 2 and FIG. 7, steps S1 to S11 will be described. Incidentally, the progress of time (sec) in FIG. 7 is an example. Moreover, the temperature of the head section 15 means a set temperature on the manufacturing apparatus side, and the actual temperature of the head section 15 does not necessarily have to coincide with the temperature of FIG. 7.

Figure 4:
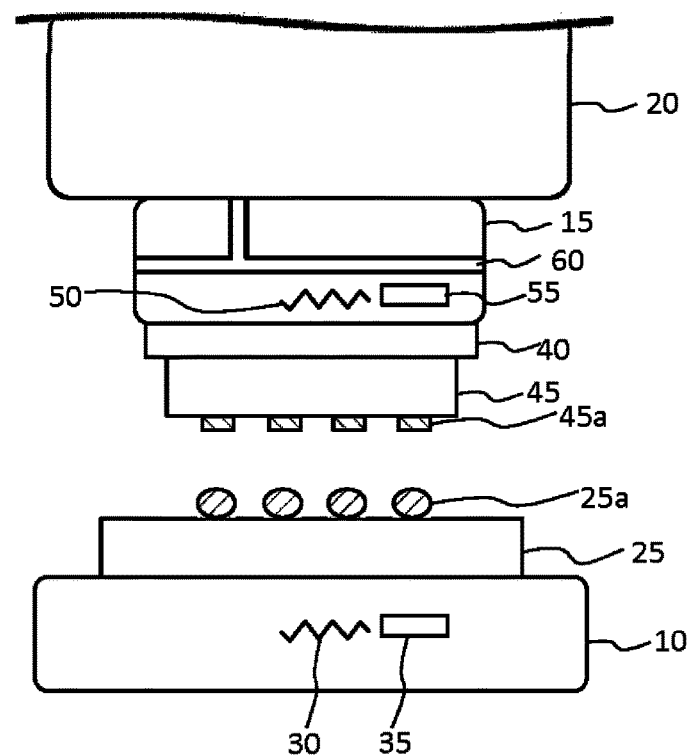
FIG. 4 is a schematic sectional view depicting a stage of the semiconductor device manufacturing method according to the embodiment.

FIG. 4 is a schematic sectional view depicting step S1.

In step S1, as depicted in FIG. 4, the head section 15 is positioned spaced from and facing the stage 10. The semiconductor element 45 is placed on the bonding tool 40 of the head section 15. The semiconductor element 45 is held on the bonding tool 40 by suction under the control of the control device 80, for example. The metal pads 45a are located on the side of the semiconductor element 45 facing the stage 10 located therebelow.

In step S2, the substrate 25 is placed on the upper face of the stage 10. The substrate 25 is held on the upper face of the stage 10 by suction under the control of the control device 80, for example. The solder bumps 25a are located on the side of the substrate 25 facing the head section 15 located thereabove. Step S1 and step S2 may be performed in reverse order or simultaneously.

In step S3, by the control device 80, the position detecting camera is located in a region between the stage 10 and the head section 15. The position detecting camera captures an image of the substrate 25 and the semiconductor element 45 which are vertically located in the Z-axis direction and detects the positions of the substrate 25 and the semiconductor element 45. Then, the control device 80 moves the stage 10 or the head section 15 in a relative manner in the XY-axes direction (the horizontal direction) and in the rotating direction in a horizontal plane based on the detected positions. As a result of this movement, the solder bumps 25a of the substrate 25 and the metal pads 45a of the semiconductor element 45 are placed in the positions in which the solder bumps 25a of the substrate 25 and the metal pads 45a of the semiconductor element 45 face one another.

Figure 5:
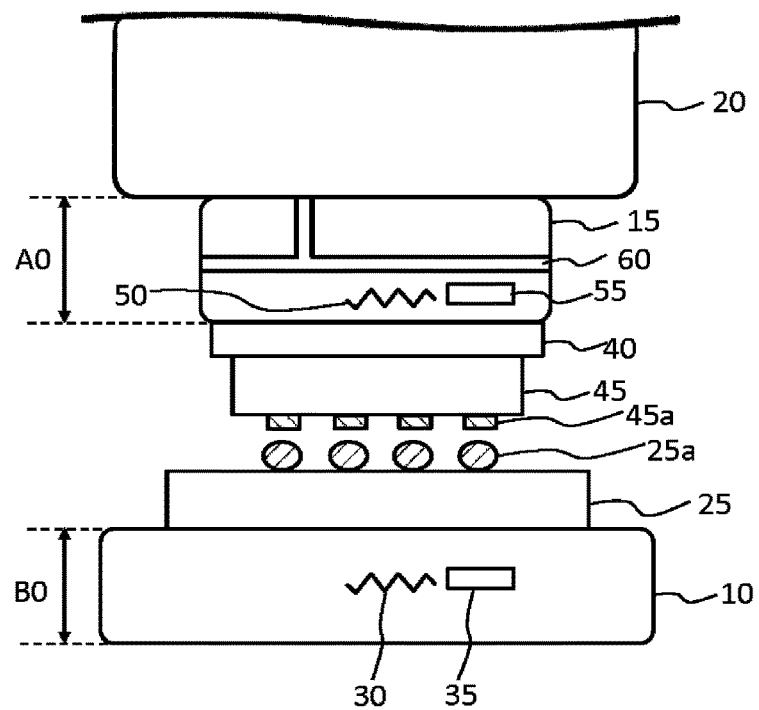
FIG. 5 is a schematic sectional view depicting a stage of the semiconductor device manufacturing method according to the embodiment.

In step S4, the control device 80 moves the head section 15 downwardly to a position close to the stage 10. FIG. 5 is a schematic sectional view depicting step S4.

First, the downward movement of the head section 15 is controlled by position control based on the sensing signal of the position sensor 70. The position of the head section shortly before the solder bumps 25a and the metal pads 45a of the semiconductor element 45 make contact with one another is set in the control device 80 in advance. Then, as a result of the control device 80 moving the head section 15 to the set position, the head section 15 is quickly moved downwardly.

Next, once the solder bumps 25a and the metal pads 45a of the semiconductor element 45 are spaced closely apart, the further downward movement of the head section 15 is controlled by load value control. That is, the control device 80 controls the downward movement of the head section 15 based on the sensed signal of the load sensor 75. A threshold value for the sensed signal of the load sensor 75 is set in the control device 80 in advance. Then, the head section 15 is moved downwardly until the solder bumps 25a and the metal pads 45a come into contact with one another. This contact is sensed as a result of the load value sensed by the load sensor 75 exceeding the set threshold value or the amount of change of the load value per unit time exceeds the set threshold value.

The height of the head section 15 in a state in step S4 in which no pressure or load is applied is set as A0 and the height of the stage 10 in that state is set as B0. Moreover, control of the downward movement of the head section 15 in step S4 may also be performed only by control of the load value without position control performed by using the position sensor 70.

Figure 6:
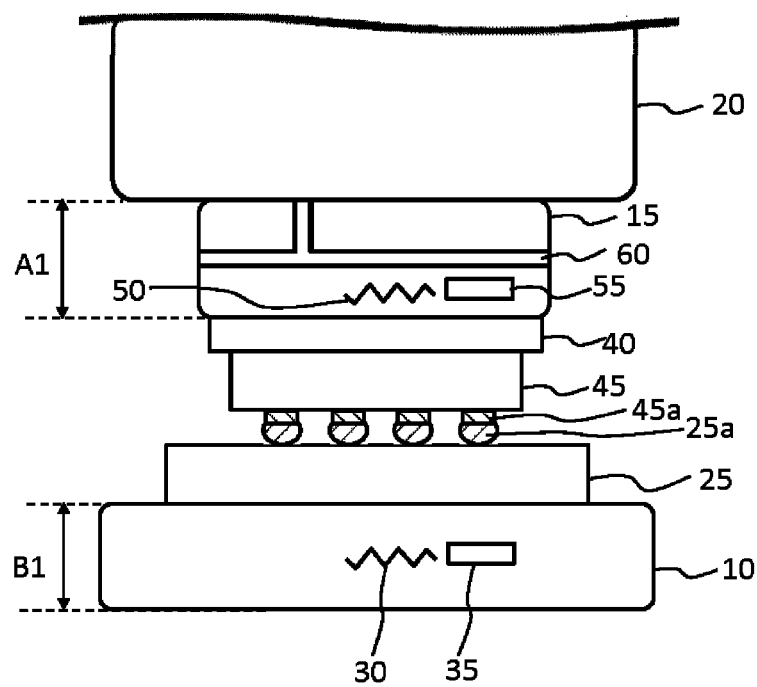
FIG. 6 is a schematic sectional view depicting a stage of the semiconductor device manufacturing method according to the embodiment.

In step S5, the head section 15 is further moved downwardly while applying a load to the stage 10 with the metal pads 45a and the solder bumps 25a interposed between the head section 15 and the stage 10. The head section 15 is moved downwardly until the load applied to the stage 10 by the head section 15 becomes a first load value (about 190 N in FIG. 7) (time t1). FIG. 6 is a schematic sectional view depicting step S5.

The metal pads 45a are pressed against the solder bumps 25a and the solder bumps 25a are compressed and deformed. Then, the natural oxide films generated on the surfaces of the metal pads 45a and the solder bumps 25a where the metal pads 45a and the solder bumps 25a make contact with one another tear, whereby the metal pads 45a and the solder bumps 25a are electrically brought into conduction.

In step S5, in a state in which the load becomes the first load value, the load is applied to the head section 15 and the stage 10 and, since pressure is applied thereto, the head section 15 and the stage 10 are compressed. That is, as depicted in FIG. 6, the height of the head section 15 is compressed to A1 (<A0) which is smaller than A0 and the height of the stage 10 is compressed to B1 (<B0) which is smaller than B0.

In step S5, as a result of the application of the load, the metal pads 45a and the solder bumps 25a are gradually deformed. As a result of this deformation, from time t1 to time t2, the position of the head section 15 is slowly lowered.

If heat is applied by the head heater 50 of the head section 15 in this state, the solder bumps 25a of the substrate 25 are heated via the bonding tool 40 and the metal pads 45a of the semiconductor element 45 and the solder bumps 25a are melted. As a result of the solder bumps 25a being melted, the load applied to the head section 15 and the stage 10 is reduced. That is, since the pressure applied to the head section 15 and the stage 10 is reduced, the heights of the head section 15 and the stage 10 are changed to the original heights A0 and B0. Furthermore, since the head section 15 expands due to the application of heat, there is a possibility that the height of the head section 15 is changed to a dimension larger than the original height A0. If the heights of the head section 15 and the stage 10 become larger than A1 and B1 due to this application of heat, various failures may occur. For example, there is a possibility that the solder bumps 25a are excessively crushed and a short circuit occurs between the adjacent solder bumps 25a. Alternatively, there is a possibility that the solder bumps 25a and the metal pads 45a are deformed, which causes an unintended short circuit or open. Furthermore, there is a possibility that the head section 15 and the stage 10 make contact with each other, which causes damage to the head section 15 or the stage 10.

Thus, in this embodiment, as step S6, the control device 80 reduces the load applied by the head section 15 while sensing the load amount by the load sensor 75. That is, the control device 80 reduces the pressure applied to the head section 15. Then, when the load amount becomes a predetermined load amount, the control device 80 stops reduction of the load applied by the head section 15 (time t2; about 10 N in FIG. 7). As a result of a reduction in the load applied by the head section 15, the pressure applied to the head section 15 and the stage 10 is reduced and the head section 15 and the stage 10 have, for example, the original heights A0 and B0 or dimensions which are larger than at least A1 and B1. That is, by bringing the heights of the head section 15 and the stage 10 close to the dimensions of the original dimensions in advance, the amount by which the heights of the head section 15 and the stage 10 are increased during a temperature rise may be reduced. Furthermore, by stopping reduction of pressure at a predetermined load amount, the state in which the solder bumps 25a and the metal pads 45a make contact with one another may be maintained. That is, the formation of an oxide film on the surfaces of the solder bumps 25a and the metal pads 45a may be suppressed.

As step S7, the control device 80 raises the temperature of the head section 15 by raising the temperature of the head heater 50 (time t3). As a result of a rise in the temperature of the head section 15, as mentioned earlier, the head section 15 thermally expands to a height larger than A0.

Figure 8:
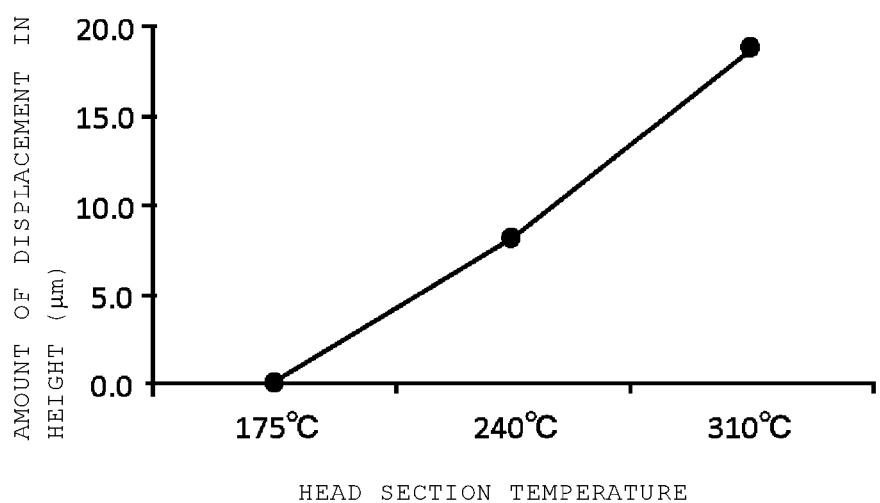
FIG. 8 is a diagram depicting a relationship between the temperature of the head section and a height of the head section.

FIG. 8 is an example of a graph depicting the relationship between the temperature and the height of the head section 15.

The vertical axis of FIG. 8 represents the amount of displacement of the head section 15 in the Z-axis direction and the horizontal axis represents the temperature of the head section 15. The amount of displacement in the Z-axis direction which is observed when the temperature of the head section 15 is 175° C. is set at "0" as a reference. The amount of displacement which is observed when the temperature is 240° C. is 8.0 μm, and the amount of displacement which is observed when the temperature is 310° C. is 18.6 μm. That is, the higher the temperature of the head section 15 is, the larger the amount of displacement of the head section 15 is.

As step S8, the control device 80 raises the position of the head section 15 in response to a change of the height of the head section 15 caused by a rise in the temperature thereof (time t4). The upward movement of the head section 15 is performed by position control performed based on the sensing signal of the position sensor 70.

There are two reasons why the head section 15 is moved upwardly after a lapse of some time from time t3. The first reason is that there is a need to keep the solder bumps 25a and the metal pads 45a in close contact with one another until the solder bumps 25a are melted. By keeping the solder bumps 25a and the metal pads 45a in close contact with one another, a situation, in which an oxide film formed on the surfaces of the solder bumps 25a and the metal pads 45a opens, may be prevented. The second reason is that thermal expansion of the head section 15 occurs after a rise in the temperature of the head section 15.

However, after the solder bumps 25a are melted, preferably, the position of the head section 15 is quickly raised because the risk of unintended activations caused by the above-described thermal expansion of the head section 15 is increased. This time t4 is set in the control device 80 in advance as a parameter. Alternatively, the time t4 may be calculated by the control device 80 based on the sensing signal of the load sensor 75.

Changes in the temperature of the head section 15 and the amount of change in the Z-axis direction caused by the thermal expansion do not always coincide with each other. The thermal expansion tends to increase linearly with time. Thus, as depicted in FIG. 7, the position control of the head section 15 in the Z-axis direction is also performed in accordance therewith.

As a result of this position control, the distance between the metal pads 45a of the semiconductor element 45 located in a lower-end part of the head section 15 and the solder bumps 25a of the substrate 25 on the side where the stage 10 is located may be maintained in a state in which the distance remains about the same.

The reason why the load value of the head section 15 increases and then reduces between time t3 and time t4 will be described. The height of the head section 15 increases due to a rise in the temperature thereof while the solder bumps 25a are being melted. However, since the position of the head section 15 is fixed, the load value increases by an amount corresponding to an increase in the height of the head section 15. When the solder bumps 25a are then melted, the load applied by the head section 15 is reduced and the load value reduces.

Incidentally, in order to avoid the above-mentioned unintended activations, preferably, the control of the position of the head section 15 is switched to the position control performed by using the sensing signal of the position sensor 70 before the load is increased in step S7.

As step S9, the control device 80 stops the application of heat to the head section 15 by stopping the application of power to the head heater 50 (time t5). Furthermore, bypassing air through the hole 60, the control device 80 speeds up heat dissipation, and thereby cools the head section 15. As a result of the application of heat applied for a fixed amount of time by time t5, the solder bumps 25a are sufficiently melted and adhere to the metal pads 45a.

As step S10, the control device 80 moves the head section 15 downwardly. As depicted in FIG. 7, the downward movement of the head section 15 may be started in advance before time t5. Alternatively, the downward movement of the head section 15 may be started at the start of cooling or after the start of cooling.

The reason why the head section 15 is moved downwardly will be described.

As a result of cooling, the head section 15 and the stage 10 begin to contract or shrink. That is, the heights of the head section 15 and the stage 10 are reduced and they pull away from one another. As a result, tension is applied between the metal pads 45a fixed to the head section 15 and the solder bumps 25a fixed to the stage 10. This tension may cause a crack in the solder bumps 25a. Thus, the head section 15 has to be moved downward in order to prevent the occurrence of this tension.

Moreover, the downward movement of the head section 15 has to be performed in response to the length by which the above-described head section 15 and stage 10 shrink or contract and thus move away from each other. If the head section 15 is moved downwardly by an excessively large extent compared to the length by which the head section 15 and the stage 10 have shrunk or contracted, a strong compressive force is applied between the metal pads 45a and the solder bumps 25a. The application of the compressive force may become the cause of an open failure caused by a crack or a rupture of the solder joint.

As a result of the downward movement of the head section 15 in step S10, the distance between the metal pads 45a of the semiconductor element 45 and the solder bumps 25a of the substrate 25 is maintained at about the same distance while the temperatures of the head 15 and stage 10 are reduced. That is, the creation of the tension and the compressive forces to the solder bumps 25a are suppressed because the shrinkage of the head 15 and the stage 10 which tends to cause the semiconductor element 45 and the substrate 25 to be pulled away from each other is compensated for by movement of one of the stage 25, the head 15, or both.

As step S11, the control device 80 senses the load applied by the head section 15 by the load sensor 75 while biasing the head section 15 downwardly. The control device 80 detects a change of the load value and, as Step 12, separates the semiconductor element 45 from the head section 15 (time t6). Specifically, the control device 80 makes the bonding tool 40 of the head section 15 end the state in which the semiconductor element 45 is caused to adhere thereto by suction. Then, the control device 80 moves the head section 15 upwardly. On the stage 10, as depicted in FIG. 3C, the substrate 25 with the solder bumps 25b to which the metal pads 45a of the semiconductor element 45 are connected with a predetermined distance d left therebetween remains, and a completed semiconductor device may be removed from the stage 10.

As the cooling of the head section 15 progresses, the solder bumps 25a are solidified. When the solidification of the solder bumps 25a starts, the state changes from the liquid state to the solid state, whereby the volume and shape of the solder bumps 25a change. As a result, the load value applied to the head section 15 changes. Thus, by sensing a change of the load value of the head section 15, the control device 80 may perform separation in response to the solidification of the solder bumps 25a. Incidentally, the solidification temperature of the solder bumps 25a is, for example, about 200° C., and the solder bumps 25a begin to be solidified when the actual temperature of the solder bumps 25a becomes the solidification temperature or lower.

According to the embodiment described above, the metal pads 45a and the solder bumps 25a are joined to one another, and, before the temperature thereof is raised, the control device 80 drives the driving section 65 and performs a pressure reduction operation (S6). As a result of the pressure reduction operation, the heights of the head section 15 and the stage 10 become close to the heights thereof observed before the head section 15 and the stage 10 contract. By making, in advance, the heights of the head section 15 and the stage 10 be close to the heights thereof before the head section 15 and the stage 10 contract, an increase in the heights of the head section 15 and the stage 10 may be suppressed when the solder bumps 25a are melted. By suppressing an increase in the height, a short circuit between the adjacent solder bumps 25a and a collision of the bonding tool 40 fixed to the head section 15 with the stage 10 may be suppressed.

Furthermore, according to this embodiment, when the head section 15 is heated, the control device 80 drives the driving section 65 in response to an increase in the height of the head section 15 and moves the head section 15 upwardly. By moving the head section 15 upwardly during heating, a short circuit between the adjacent solder bumps 25a and a collision of the bonding tool 40 with the stage 10 may be suppressed.

In addition, according to this embodiment, when the head section 15 is cooled, the control device 80 drives the driving section 65 in response to a reduction in the height of the head section 15 and moves the head section 15 downwardly in the direction of the stage 10. By moving the head section 15 downwardly during cooling, an increase in the tension between the solder bumps 25a and the metal pads 45a is reduced, whereby rupture or separation of the solder bumps 25a and the metal pads 45a may be reduced.

Furthermore, according to this embodiment, when the semiconductor element 45 is separated from the bonding tool 40, the control device 80 performs the separation by sensing a change of the load value of the head section 15. The detection of a change of the load value allows the semiconductor element 45 to be separated before the solder bumps 25a are completely solidified. By separating the semiconductor element 45 before the solder bumps 25a are completely solidified, the tension and the compressive forces between the solder bumps 25a and the metal pads 45a may be reduced. Moreover, by performing separation at an early stage, the throughput of the manufacturing a semiconductor device is enhanced, whereby manufacturing an inexpensive semiconductor device is achieved. Furthermore, as a result of the semiconductor device being separated from the head section having large heat capacity as compared to the semiconductor device, the semiconductor device may be cooled rapidly. Rapid cooling may suppress the solid state diffusion of a solder material contained in the solder bumps 25a into the semiconductor device. As a result of the solid state diffusion of the solder material being suppressed, the reliability of the semiconductor device may be increased. Incidentally, it goes without saying that there is no need to perform the separation before all the solder bumps 25a are completely solidified. No problem arises even when some of the solder bumps 25a are solidified. Also in this case, the above-described throughput may be enhanced.

(Other Embodiments)

In addition to the embodiment described above, application to the following modified embodiments is also possible.

In the embodiment described above, the solder bumps 25a are used; however, the embodiment is not limited thereto. For example, a substrate provided with metal bumps or metal balls will suffice.

Even when the metal bumps are provided on the semiconductor element 45 side, implementation is also possible. That is, application to a structure in which the metal bumps are provided on at least any one of the substrate 25 and the semiconductor element 45 is possible.

Figure 9:
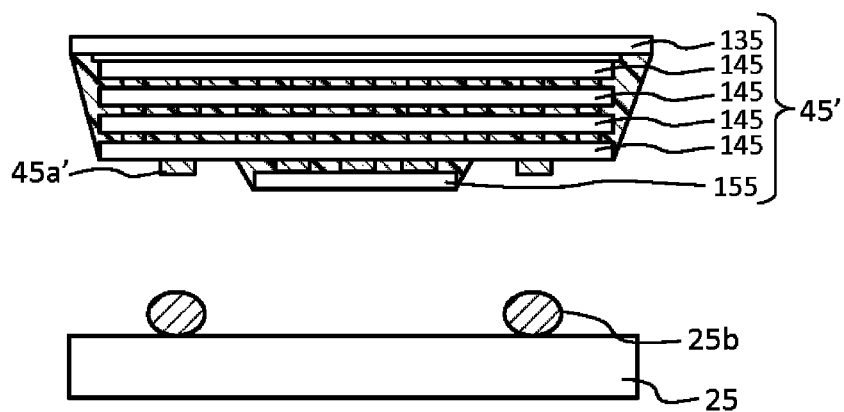
FIG. 9 is a schematic sectional view depicting another embodiment of the semiconductor device.

The semiconductor element 45 is not limited to the semiconductor element 45 depicted in FIG. 3A. For example, a semiconductor element 45' formed of stacked layers as depicted in FIG. 9 may also be adopted. The semiconductor element 45' in FIG. 9 is obtained by stacking semiconductor chips 145 and a semiconductor chip 155 on a substrate 135. Metal pads 45a' of the semiconductor element 45' are further from the substrate 25 than is the semiconductor chip 155. To prevent a collision between the semiconductor chip 155 and the substrate 25, higher-precision position control in bonding the metal pads 45a' and solder bumps 25a is required.

Cooling by passing air through the cooling hole is not always required. Moreover, as the cooling method, any cooling means other than air cooling may be adopted.

Furthermore, in the embodiment described above, the driving section 65 is placed in the head section 15, but the driving section 65 may be placed in the stage 10. The driving section 65 only has to be capable of moving the head section 15 and the stage 10 close to each other or away from each other. That is, the driving section 65 may move the head section 15 toward the stage 10, move the stage 10 toward the head section 15, or move the head section 15 toward the stage 10 and move the stage 10 toward the head section 15.

Likewise, the position sensor 70 and the load sensor 75 do not necessarily have to be placed in the head section 15. That is, when the driving section 65 moves the stage 10, the position sensor 70 and the load sensor 75 may be placed in the stage 10.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device using a semiconductor device manufacturing apparatus including a stage configured to hold a substrate, a head section facing the stage and configured to hold a semiconductor element, a driving section configured to drive one of the head section and the stage to move relative to one another in a first direction intersecting the head section and the stage and apply a load to the other one of the head section and the stage, a load sensor configured to sense a load value of the applied load, and a heating portion configured to heat the head section, the method comprising:
- moving one of the head section and the stage in the first direction towards the other with the driving section and applying the load to the other until the load value becomes a first value;
- moving the head section away from the stage with the driving section to reduce the applied load until the load value becomes a second value which is smaller than the first value;
- after the semiconductor element is pressed against the stage with the reduced load, heating the head section with the heating portion;
- terminating the heating after a period of time to allow the head section to cool;
- during the cooling of the head section, maintaining a desired distance between the stage and the head section by moving one of the head section and the stage in the first direction towards the other one of the head section and the stage with the driving section; and
- separating the semiconductor element from the head section in accordance with a change in the load value.

2. The method according to claim 1, further comprising:
- after the semiconductor element is separated from the head section, moving one of the head section and the stage away from the other.

3. The method according to claim 1, wherein
- a metal bump is provided on one of the substrate and the semiconductor element and a metal electrode is provided on the other of the substrate and the semiconductor element, and
- the metal bump is not completely solidified at the time the semiconductor element is separated from the head section.

4. The method according to claim 1, further comprising:
- moving the head section away from the stage after the head section is heated to a desired temperature and before the heating is terminated.

5. A method of manufacturing a semiconductor device using a semiconductor device manufacturing apparatus including a stage configured to hold a substrate, a head section facing the stage and configured to hold a semiconductor element, a driving section configured to drive one of the head section and the stage to move relative to one another in a first direction intersecting the head section and the stage and apply a load to the other one of the head section and the stage, a load sensor configured to sense a load value of the applied load, and a heating portion configured to heat the head section, the method comprising:
- moving one of the head section and the stage in the first direction towards the other with the driving section;
- while the semiconductor element is pressed against the stage, heating the head section with the heating portion so that solder on the substrate is melted;
- when the load value becomes substantially zero after the solder is melted, moving one of the head section and the stage in a second direction opposite to the first direction;
- terminating the heating after a period of time to allow the head section to cool;
- during the cooling of the head section, maintaining a desired distance between the stage and the head section by moving one of the head section and the stage in the first direction towards the other one of the head section and the stage with the driving section; and
- separating the semiconductor element from the head section in accordance with a change in the load value.

6. The method according to claim 5, further comprising:
- after the semiconductor element is separated from the head section, moving one of the head section and the stage away from the other.

7. The method according to claim 5, wherein
- a metal bump is provided on one of the substrate and the semiconductor element and a metal electrode is provided on the other of the substrate and the semiconductor element, and
- the metal bump is not completely solidified at the time the semiconductor element is separated from the head section.

8. The method according to claim 5, further comprising:
- when one of the head section and the stage is moved in the first direction towards the other with the driving section, applying the load to the other until the load value becomes a first value, and
- moving the head section away from the stage with the driving section to reduce the applied load until the load value becomes a second value which is smaller than the first value, wherein
- the head section is heated with the heating portion after the semiconductor element is pressed against the stage with the reduced load.

9. The method according to claim 5, further comprising:
- moving the head section away from the stage after the head section is heated to a desired temperature and before the heating is terminated.

* * * * *